United States Patent
Melcher et al.

(10) Patent No.: US 8,601,202 B1
(45) Date of Patent: Dec. 3, 2013

(54) FULL CHIP WEAR LEVELING IN MEMORY DEVICE

(75) Inventors: Robert Melcher, Folsom, CA (US); Sean Eilert, Penryn, CA (US); Gerard Kreifels, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 565 days.

(21) Appl. No.: 12/548,375

(22) Filed: Aug. 26, 2009

(51) Int. Cl.
*G06F 13/00* (2006.01)

(52) U.S. Cl.
USPC ............ 711/103; 711/159; 711/165; 711/173

(58) Field of Classification Search
None
See application file for complete search history.

(56) References Cited

U.S. PATENT DOCUMENTS

| | | | |
|---|---|---|---|
| 6,396,744 B1 | 5/2002 | Wong | |
| 6,522,586 B2 | 2/2003 | Wong | |
| 6,662,263 B1 | 12/2003 | Wong | |
| 6,731,557 B2 | 5/2004 | Beretta | |
| 7,079,422 B1 | 7/2006 | Wong | |
| 7,224,604 B2 | 5/2007 | Lasser | |
| 2007/0083698 A1* | 4/2007 | Gonzalez et al. | 711/103 |
| 2009/0089485 A1* | 4/2009 | Yeh | 711/103 |
| 2009/0172255 A1* | 7/2009 | Yeh et al. | 711/103 |
| 2009/0259819 A1* | 10/2009 | Chen et al. | 711/165 |
| 2010/0169541 A1* | 7/2010 | Freikorn | 711/103 |
| 2010/0174845 A1* | 7/2010 | Gorobets et al. | 711/103 |
| 2010/0306446 A1* | 12/2010 | Villa et al. | 711/102 |
| 2010/0313065 A1* | 12/2010 | Feeley et al. | 714/6 |

* cited by examiner

*Primary Examiner* — Kevin Verbrugge
*Assistant Examiner* — Stella Eun
(74) *Attorney, Agent, or Firm* — Schwegman, Lundberg & Woessner, P.A.

(57) ABSTRACT

Methods and systems to wear level a non-volatile memory device across partitions. In an embodiment, a memory device performs background operations to swap host addressable memory partitions with a spare memory partition outside of the host address space. In one embodiment, the background inter-partition wear leveling operations are appended to a user erase operations.

21 Claims, 15 Drawing Sheets

FIG. 6B  FIG. 6C ns have not been drawn to scale. For example, the dimensions of

FULL CHIP WEAR LEVELING IN MEMORY DEVICE

TECHNICAL FIELD

Embodiments of the invention are in the field of memory devices, and more specifically pertain to wear leveling in memory devices.

BACKGROUND

A NOR or NAND flash EEPROM memory cell, as well as many other types of memory cells known in the art, may be written a limited number of times during the cell lifetime. While the number of write cycles is dependent on the memory cell technology, after an address reaches its specified write cycle limit, it may no longer operate according to designed specifications.

Wear leveling techniques have been employed by memory devices to reduce disparities in the write cycles, but such techniques are typically confined to level the wear of a memory cell or group of cells within a subdomain of the memory device. For example, in some flash memory devices wear leveling is performed at a block level of granularity within a physical partition of the memory device to level write cycles across the blocks within the single physical partition. In such block level methods, wear leveling is performed independently within each partition of the memory device.

While wear leveling within a given partition may be conveniently implemented by swapping two blocks within the partition containing a target block being erased by a user or host of the memory device, a disparity in write cycles between blocks in separate partitions may still occur and reduce the lifetime of the memory device. Furthermore, read while write (RWW) restrictions generally preclude direct application of block wear leveling algorithms to wear level across partitions because a background copy of a block from one partition of a memory device to a different partition could conflict with a user read request.

BRIEF DESCRIPTION OF THE DRAWINGS

Embodiments of the invention are particularly pointed out and distinctly claimed in the concluding portion of the specification. Embodiments of the invention, however, both as to organization and method of operation, together with objects, features, and advantages thereof, may best be understood by reference to the following detailed description when read with the accompanying drawings in which:

FIGS. 6B-6C illustrate changes logical block addresses of a spare partition performed by a memory device in the prepare copy state depicted in FIG. 3, in accordance with an embodiment of the present invention;

Figure 1:
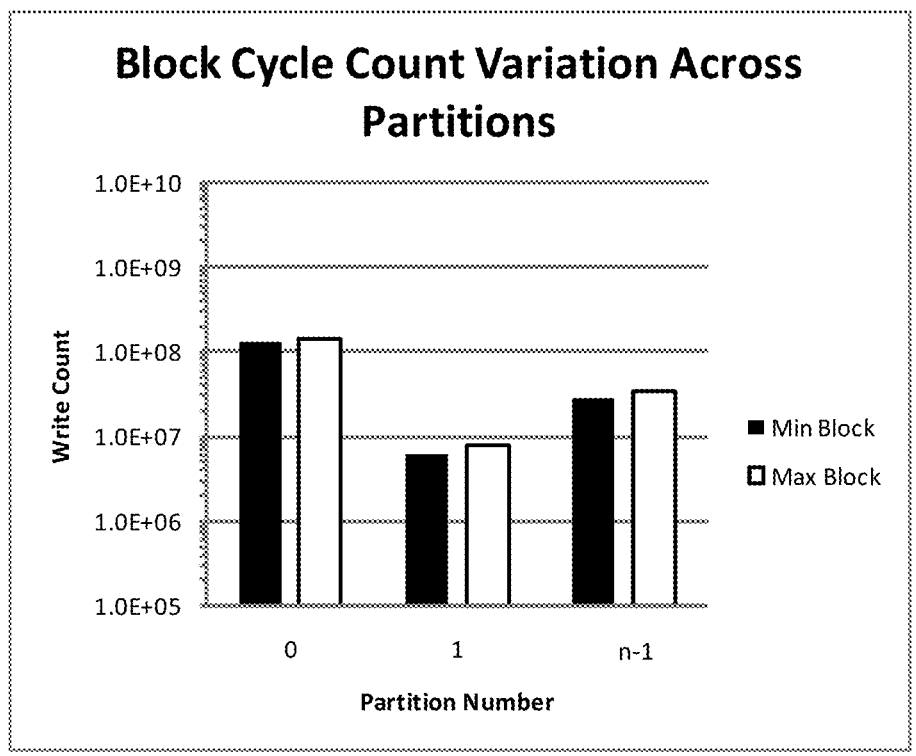
FIG. 1 illustrates a bar graph showing a disparity in the number of writes to memory blocks within separate partitions over a time interval a memory device is operated.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of embodiments of the invention. However, it will be understood by those skilled in the art that other embodiments may be practiced without these specific details. In other instances, well-known methods, procedures, components and circuits have not been described in detail so as not to obscure the present invention. Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, levels, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause and effect relationship).

Methods and systems to wear level memory cells across partitions in a non-volatile memory device are described herein. While the embodiments describe herein provide particular details in the context of flash memory devices (NOR and NAND), one of ordinary skill in the art will appreciate that such a wear leveling methods and systems may be readily applied to other non-volatile memory technologies, such as PCM, MRAM, FRAM, etc. It should be noted that because the exemplary embodiments described herein are in the context of flash memory devices, a "block" refers to a population of memory cells which is erased as a group. However, for embodiments employing memory technologies, such as PCM, where individual cells may be modified, a "block" is generally analogous to a single "cell" or a population of cells which may be conveniently operated on as a unit at a time, such as sequentially addressed cells, and the like. As such, the methods and systems described herein may be readily applied to any memory device with RWW or other concurrent operations partitioning and an erase/write capability for which cycles may be tracked.

FIG. 1 illustrates a bar graph showing a disparity in the number of writes to memory blocks within separate partitions after an arbitrary time during which a non-volatile memory device is operated. As depicted, the difference in write cycles between a minimum cycle count cell population (e.g., block in flash memory) and a maximum cycle count cell population within a particular physical partition may be kept small with wear leveling methods employed within each partition. However as further shown, a relatively large disparity in average write counts between physical partitions (e.g., partition 0 and 1) may occur. Where a low density product does not have a large enough memory cell population within a physical partition, the average cycle count in a particular physical partition may fail to meet reliability requirements of a memory device. The inter-partition wear leveling (e.g., wear leveling across physical partitions partition 0, 1, . . . n−1) methods and systems described herein may tighten the distribution of average write cycle counts across physical partitions and thereby increase the lifetime of a memory device.

Figure 2:
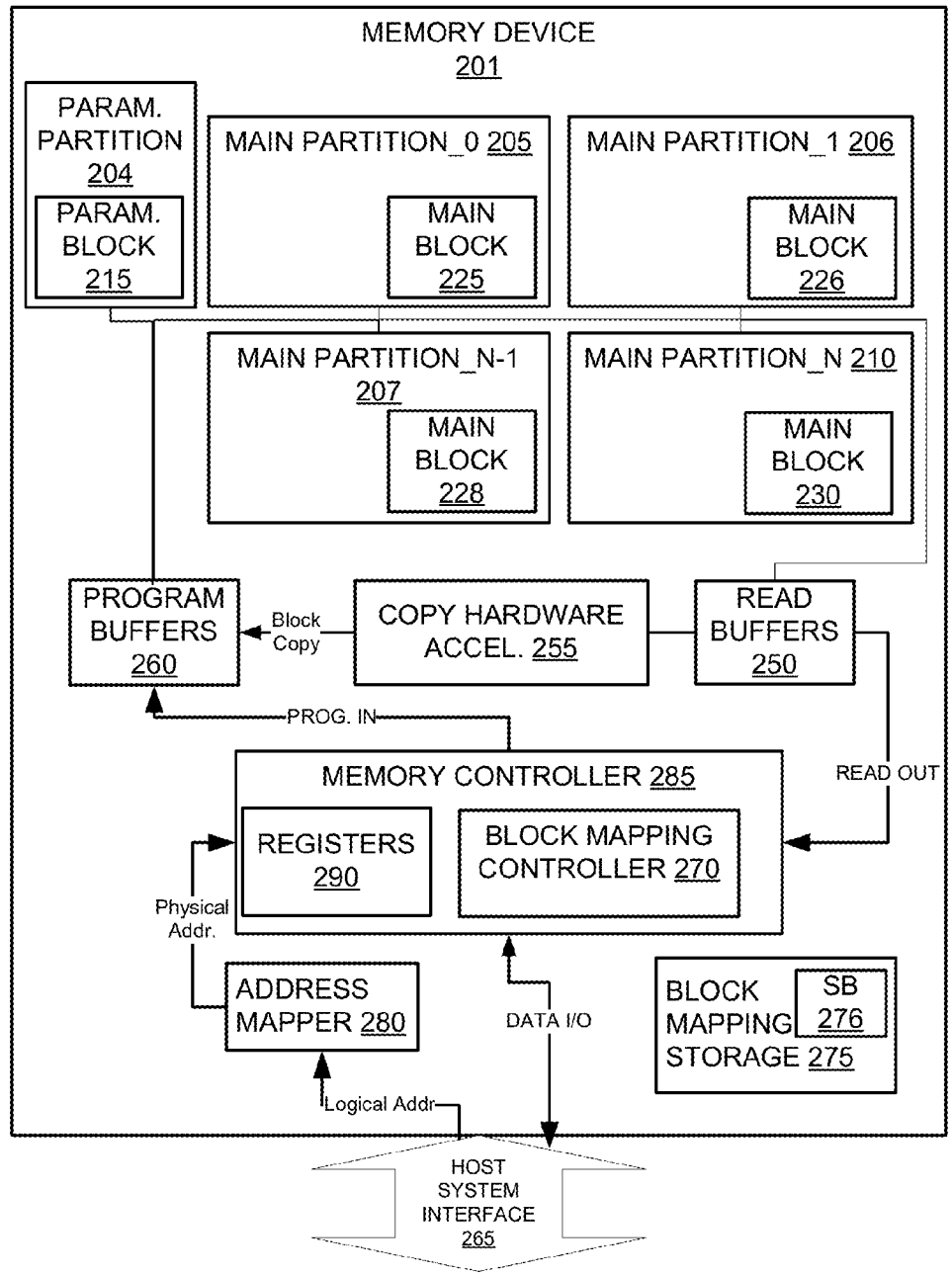
FIG. 2 depicts a block diagram of a memory device configured to perform wear leveling across memory partitions, in accordance with an embodiment of the present invention.

FIG. 2 depicts a block diagram of a memory device 201 configured to perform wear leveling across physical memory partitions, in accordance with an embodiment of the present invention. Depending on the memory cell technology, each physical memory partition may further include a subgrouping of cells, such as erasable memory blocks in a flash memory device. The size of such blocks may vary within the memory device 201. For example, in one embodiment, blocks of a first size, referred to herein as "parameter" blocks, are a different size than blocks of a second size, referred to herein as "main" blocks. Each main block typically includes a same number of user addressable memory cells. The main memory blocks 225, 226 and 228 are provided in the main physical partition_0 205, main physical partition_1 206 and sequentially addressed up through main physical partition_N−1 207 and provide user (i.e., host) addressable memory cell populations accessible to a user via the host system interface 265. Each main physical partition 205-207 is a configured to provide read write access concurrently with the other main partitions through decoder and sense schemes conventional in the art. As an example, a flash memory device may include 16 main physical partitions with each main physical partition including 32 main blocks. Each of the main partitions may further include any number of blocks not mapped to the user's/host address space, such as redundancy blocks, etc.

As further depicted, the memory device 201 also includes a physical parameter partition 204 which comprises one or more parameter blocks (e.g., parameter block 215). One logical partition may include both a parameter block in the physical parameter partition 204 (e.g., parameter block 215) and a main block from a main partition (e.g., main block 225). In particular embodiments, the parameter block 215 logically includes fewer cells than a main block but physically contains the same number of memory cells as a main memory block in a main partition (e.g., main block 225) to allow swapping of a main block with a parameter block within the logical partition that includes both the main block and the parameter block as part of an intra-partition wear leveling algorithm.

The main physical partition_N 210 is a partition configured in a manner substantially the same as the main physical partitions 205-207, however the memory cells in the main physical partition_N 210 are not mapped to the user's address space separately from the main physical partitions 205-207. As such, the user's address space spans only the main physical partitions 205-207 and the main physical partition_N 210 is reserved for background memory management operations performed by the memory device 201 (e.g., main physical partition_N 210 is reserved as a spare physical location to store data being swapped during inter-partition wear leveling). The main physical partition_N 210 includes the main block 230. In exemplary embodiments, the number of physical memory blocks in the main physical partition_N 210 is at least equal to the number of user addressable main memory blocks in the main physical partitions 205-207. In particular embodiments, the main physical partition_N 210 provides storage capacity to allow a rotation of the user addressable main physical partitions 205-207 to effect inter-partition wear-leveling. For example, each of the main physical partitions 205-207 may sequentially cycle through a state of being unmapped to the user addressable address space (i.e., each temporarily assuming the state of the main physical partition_N 210 while main physical partition_N assumes the state of a user addressable main physical partition).

As further depicted, memory device 201 includes read buffers 250 to buffer data sensed from any of the main physical partitions 205-207 or spare physical partition 210 and program buffers 260 to buffer data being programmed to any of the main physical partitions 205-207 or the spare physical partition 210. A copy hardware accelerator (CHA) 255 is coupled to the read buffers 250 and program buffers 260. The purpose of the CHA 255 is to quickly load the program buffers 260 with data sensed during a block read performed as a background operation in support of one or more of the inter-partition wear leveling methods described herein. The CHA 255 is configured to quickly detect an external user read attempt (through the host system interface 265) of the same block being background read through the CHA 255 and upon such a circumstance halt the background read to allow the external user read to occur. In a particular embodiment, the functionality of the CHA 255 is provided with a circuit to more quickly detect and respond to external user read attempts than may be done through a microcontroller implementation, although alternative embodiments may nonetheless utilize a microcontroller implementation rather than the hardware CHA 255 depicted in FIG. 2.

The exemplary memory device 201 further includes address mapper 280 to manage associations between logical partition addresses and physical partition addresses inside the memory device 201. The address mapper 280 receives a host address signal via the host system interface 265 signifying a user read or write of data I/O. The host system identifies particular data stored in the memory device 201 with the logical address. In response to receiving the logical address signal, the address mapper 280 provides a physical address signal indicative of a physical partition of the memory cell(s) in the memory device 201 that stores the data associated with the logical partition address. During the inter-partition wear leveling operations described herein, the address mapper 280 may change the mapping between the logical and physical partition addresses so that stored data may be relocated from one physical partition to another physical partition while the data stored therein remains accessible to the host system via a same logical address. The inter-partition wear leveling operations may therefore be performed as background processes transparent to the host system and/or user.

A block mapping storage 275 provides non-volatile storage of the logical to physical address associations and may further provide storage for one or more status bits 276. The block mapping storage 275 may be a reserved area of the memory cell array. In a particular embodiment, the block mapping storage 275 is a portion of the logical spare partition, which depending on the state of the inter-partition wear leveling, may correspond to the spare physical partition 210 or one of the main physical partitions 205-207. The Status bits 276 in the exemplary implementation depicted in FIG. 2 may provide counting functions for triggering or otherwise managing the inter-partition wear leveling operations which are performed in a non-atomic manner as a sequential collection of background operations which may be frequently interrupted by a host system accessing the memory device 201. For example, in one embodiment, one of the status bits 276 is set each time a user erase occurs as a basis for triggering a wear leveling partition swap. In another embodiment, one of the status bits 276 is set each time a block from the logical partition next to be swapped (i.e., swap partition) is copied into the logical spare partition as a means of identifying which blocks in a swap partition remain to be copied upon resuming wear leveling operations after an interruption. As another example, the block mapping storage 275 may further include a status bit 276 or other indication of which physical partition 205-207 or 210 is currently the logical swap partition that is next in line to swap with the logical spare partition.

Memory device 201 further includes a memory controller 285 to control the functions of each main physical partition 205-207 in any manner known in the art. The memory controller may further include a block mapping controller 270 providing an engine (hardcoded as circuitry or implemented as microcode executed on a processor of the controller) to execute one or more of the cross-partition wear leveling algorithms described herein. In a particular embodiment, the block mapping controller 270 is a state machine controlling interactions between various other components of the memory device 201 as a function of the controller's state.

The memory controller 285 includes or is coupled to registers 290 which are set by the memory controller 285 to communicate the inter-partition wear leveling operations to the address mapper 280 and/or the block mapping storage 275. In one exemplary embodiment, registers 290 are loaded with memory block maps associating logical block addresses with physical block addresses in either or both of the spare physical partition 210 and one or more of the main physical partitions 205-207. Values of the registers 290 once loaded by the block mapping controller 270 may then be utilized by the address mapper 280 and/or stored to the block mapping storage 275 to access data stored in the memory device 201 which has been physically moved from a swap partition to a spare partition to level cell wear across the partitions.

Figure 3:
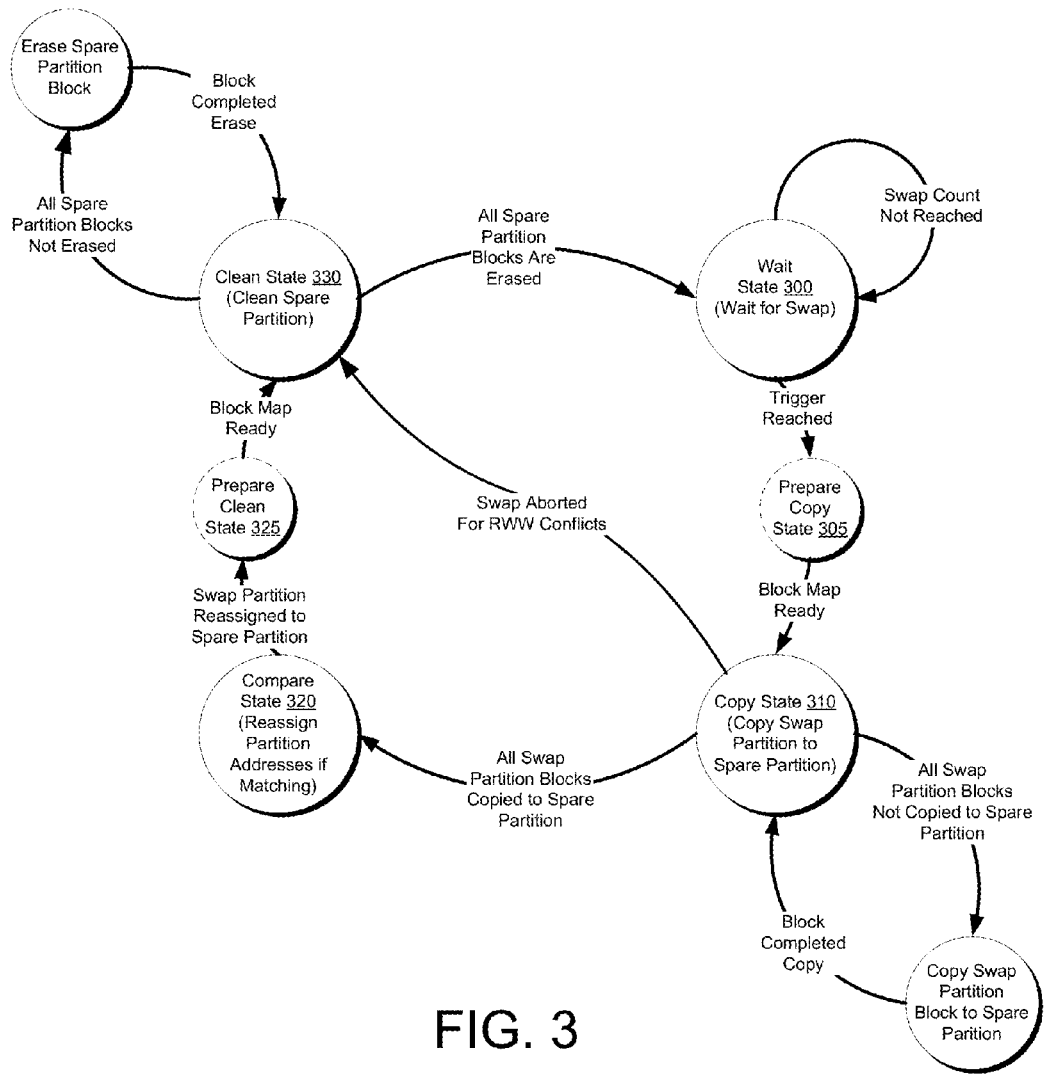
FIG. 3 depicts a state diagram illustrating particular states of a memory device configured to perform wear leveling across memory partitions, in accordance with an embodiment of the present invention.

FIG. 3 depicts a state diagram illustrating exemplary states which block mapping controller 270 may enter to conduct inter-partition wear leveling in the memory device 201. All states depicted in FIG. 3 may continuously be transitioning substantially as background operations of a memory device throughout the device's lifetime. In particular embodiments where background inter-partition wear leveling operations are performed as appendices to user operations, such as user erases, execution of the wear leveling operations associated with any given state may require a number of user operations to complete. In further embodiments, the inter-partition wear leveling states may exist on top of other background operations, such as intra-partition wear leveling operations. In such an embodiment, intra-partition wear leveling performed in any manner known in the art is combined with the inter-partition wear leveling states depicted in FIG. 3 to provide full chip wear leveling with a narrow distribution of cycle counts across all user addressable memory cells.

Generally, the inter-partition wear leveling states include the wait state 300 during which the memory device waits for a predefined condition to trigger partition swapping activity. Upon triggering, the state is advanced to the prepare copy state 305 where logical to physical addresses of a spare partition are remapped to accommodate the subsequent copy state 310. During the copy state 310, logical blocks from a designated swap partition are copied into the corresponding logical blocks of the spare partition. Following the copy state 310, the compare state 320 performs a comparison operation to verify the spare partition data pattern matches that of the swap partition and if so, reassigns the logical swap partition addresses to the spare partition, substantially completing a partition swap. At the prepare clean state 305, logical block addresses from the swap partition may be readied to accommodate the subsequent clean state 330. During the clean state 330, blocks from the swap partition (which were replaced during the compare state 320) are erased to generate a new spare partition in preparation for another cycle beginning again at the wait state 300.

Thus, for each partition swap cycle, the swap partition of the previous cycle is the spare partition of the subsequent cycle. An initial cycle may begin with the logical spare partition set to a physical partition otherwise not in use by the memory device, for example spare physical partition 210 of FIG. 2. For each cycle, the logical swap partition may be either randomly selected from the remaining pool of memory partitions or may be selected on the basis of some other logic (e.g., maximum average block cycle counts, or the like). In a particular embodiment however, the initial swap partition of a memory device is selected randomly or pseudo-randomly. In a further embodiment, for each partition swap cycle subsequent to the initial cycle, the partition following the previous swap partition (i.e. logically addressed sequentially) is selected as the swap partition. As such, the swap cycle depicted in FIG. 3 rotates through all partitions of a memory device, partition by partition, following a sequential ordering. Thus, for the memory device 201, if main partition_0 205 was selected as the swap partition of the first cycle, main physical partition_1 206 would then be selected on the second cycle. This sequential selection would continue up through all partitions until the last partition, main physical partition_n 207 is selected as the swap partition, completing one full memory partition rotation. A subsequent partition rotation would begin with main partition_0 205 again selected as the swap partition.

The individual states depicted in FIG. 3 are now described in more detail with reference to FIGS. 4-10. Beginning at the wait state 300, a memory device may be monitored for a triggering event. Generally, any measurable type of degradation could be used by someone skilled in the art as a trigger event for the wear leveling algorithm to exit the wait state. In one advantageous embodiment, the number of erase cycles of a memory device is counted and upon reaching a predetermined threshold, the wear leveling algorithm exits the wait state. In certain embodiments, the triggering event may be based a count of erase/program cycles that have occurred in one or more partitions. For example, minimum and maximum cycle count partitions may be determined based on a partition-specific cycle count and the triggering event then based on reaching a predefined disparity between the minimum and maximum cycle counts. Alternative embodiments may employ erase cycle counts for individual blocks, or increased time to perform an erase or program operation (e.g., erase time push-out, or program time push-out). In other alternative embodiments, an incidence of errors or correctible errors is counted and the wait state is exited when upon reaching a predetermined threshold level. In still other embodiments, time counts may be employed such that the wait state is exited on a periodic basis.

Figure 4:
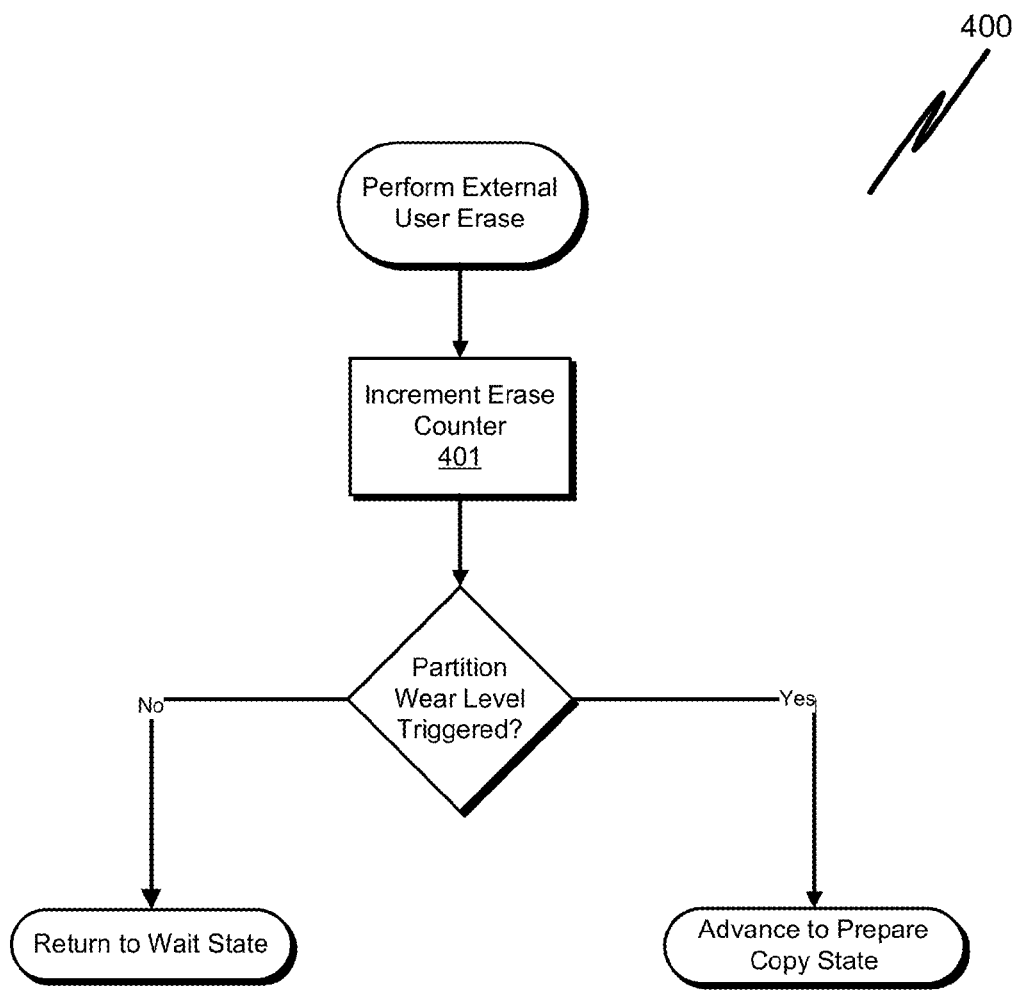
FIG. 4 depicts a flow diagram illustrating particular operations performed by a memory device in the wait state depicted in FIG. 3, in accordance with an embodiment of the present invention.

In an exemplary embodiment further depicted in FIG. 4, inter-partition wear leveling is triggered based on a total number of external user erases performed by the memory (across all partitions). Such a triggering method advantageously reduces the number of counters required. It has also been found that with triggering based on a user erase cycle count, a sequential partition rotation can greatly improve the distribution of partition wear (average or maximum cycle count). At operation 401, a counter is incremented in response to a memory device performing an external user erase. The counter may be implemented in any manner known in the art. As one example, a counter may be implemented by programming a cell in the logical spare partition of the memory device and then counting the number of programmed cells to determine if a threshold count has been reached. If the partition wear leveling threshold has not been reached, the wait method 400 returns to the wait state until another external user erase is performed. If the partition wear leveling threshold (e.g., a predefined number of external user erases) is met, then the wait method 400 proceeds to advance out of the wait state to the prepare copy state 305, as depicted in FIG. 3.

In an embodiment, background operations during the prepare copy state are dependent on a determination of which logical partition is the swap partition. If necessary, while in the prepare copy state 305, a memory device remaps the logical addresses of the spare partition to exclude some portion of the physical memory in the swap partition from the wear leveling pool. The prepare copy state 305 allows certain user addressable memory cells of the swap partition to remain in a same physical location (i.e., not swapped to another physical partition) while other user addressable memory cells of the swap partition are moved to another physical location (i.e., swapped).

In one embodiment, inter-partition wear leveling swaps physical blocks mapped to a main plane (i.e., main blocks) but does not swap physical blocks mapped to a parameter plane (i.e., parameter block). Such an embodiment allows the physical parameter blocks to remain logically part of a same logical partition (e.g., LP:0 depicted in FIG. 6) which has the benefit of not requiring extra blocks in all physical partitions (e.g., main partitions_0-N) to support a swapping of the logical parameter blocks during inter-partition wear leveling. With data in a physical parameter block (e.g., parameter block 215) not to be moved while data in a physical main block (e.g., main block 225) is to be moved during inter-partition wear leveling, the mapping of logical blocks within the spare partition needs to discriminate between blocks based on whether they are to be copied or not rather than simply carrying the swap partition map over to the spare partition as could be done if all blocks were copied. To maintain a mapping to blocks in the parameter plane which are not moved, the spare partition block mapping is revised during the prepare copy state 305 in preparation for copying the swap partition to the spare partition.

Figure 5:
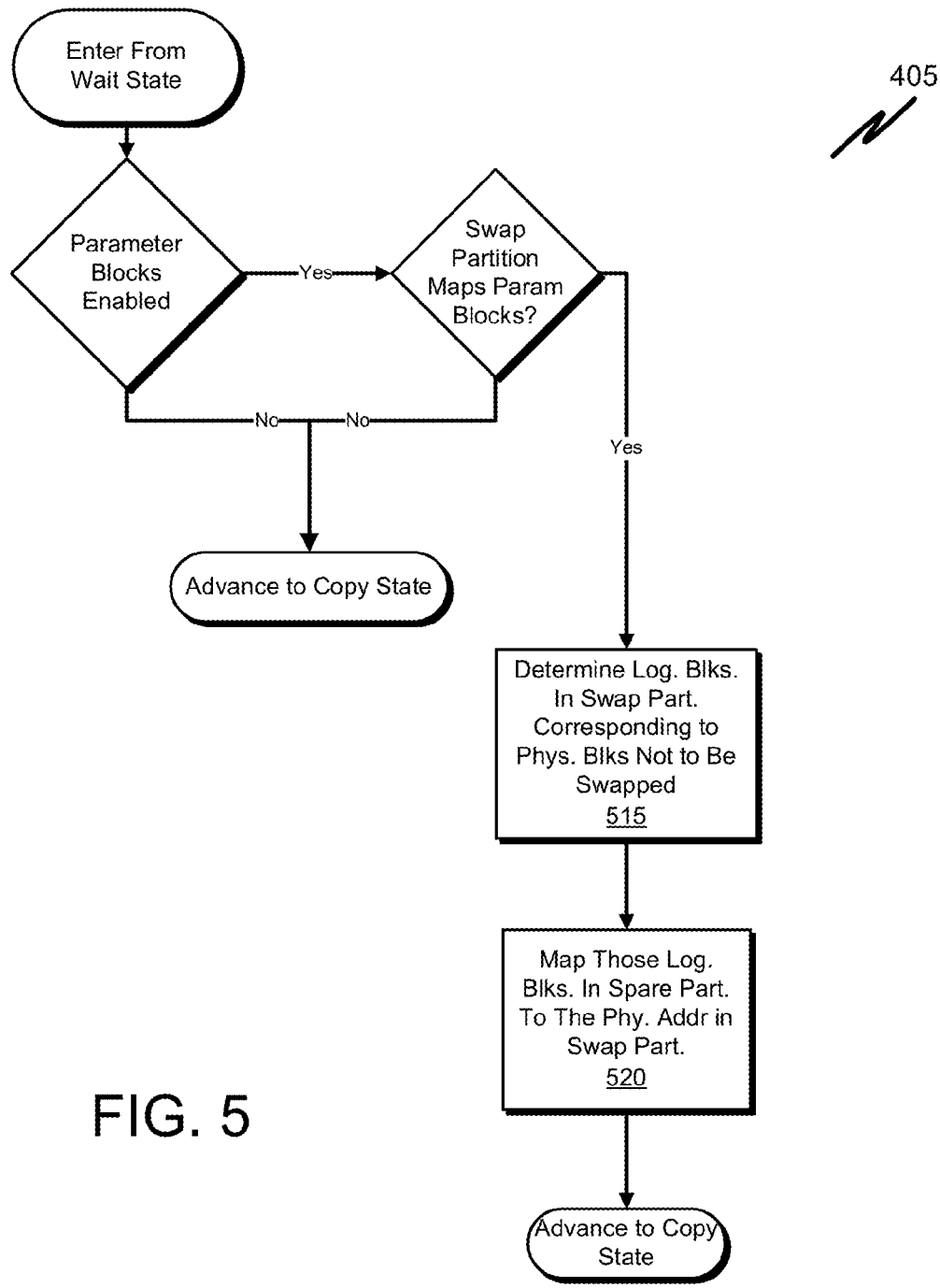
FIG. 5 depicts a flow diagram illustrating particular operations performed by a memory device in the prepare copy state depicted in FIG. 3, in accordance with an embodiment of the present invention.
Figure 6A:
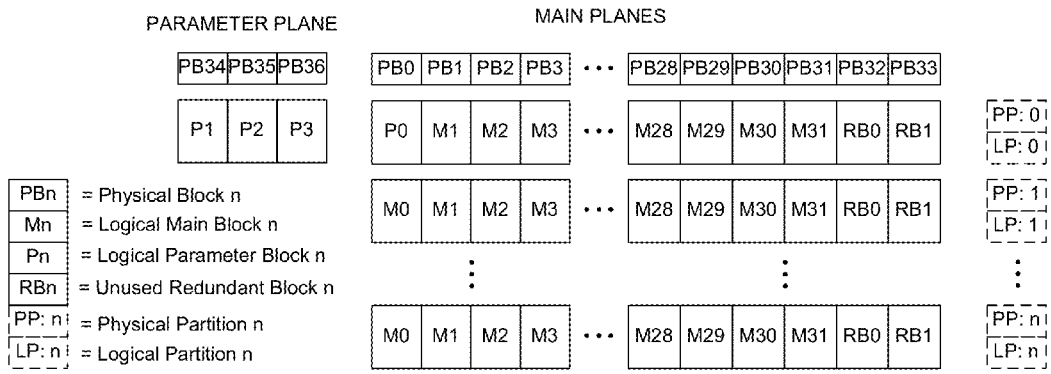
FIG. 6A illustrates a parameter plane and a main plane of blocks in the memory device, in accordance with an embodiment of the present invention.

FIG. 5 illustrates an exemplary embodiment of a prepare copy method 405 performed during the prepare copy state 305 where a flash memory device includes the parameter block 215 depicted in FIG. 2, which is not to be swapped into another partition along with main block 225. FIG. 6A depicts an exemplary parameter plane and main plane of a memory partition, such as main partition_0 205. As illustrated, PB0-PB33 are physical main block addresses (which include two redundant blocks, PB32 & PB33) while PB34-PB36 are physical parameter block addresses. In the state depicted, only physical partition/logical partition 0 includes both logical main blocks M1-M31 and logical parameter blocks P0-P3. The remaining partitions include only logical memory blocks in the main plane (main blocks M0-M31). In one embodiment where not all of the physical partitions PP:0 through PP:n include address space in the parameter plane, physical blocks in the PB34-PB36 address space are excluded from partition wear leveling.

Referring back to FIG. 5, if the parameter block 215 is not enabled or the swap partition does not include logical addresses corresponding to the logical address space of the parameter block 215 (e.g., the swap partition is LP:1-LP:n in FIG. 6A), then the prepare copy state 305 exits and the state is advanced to the copy state 310. If however, the swap partition has logical main block addresses mapped into the physical parameter partition blocks, then operation 515 is performed to clean up the swap partition before it is swapped into the spare partition. For example, where parameter block 215 is enabled and the swap partition does include logical main block addresses mapped into the parameter block 215, then, at operation 515, those logical main block addresses mapped into the parameter block 215 are mapped in the spare partition to point to the physical main partition. This may be necessary, for example, when intra-partition wear leveling previously performed on the swap partition has swapped a parameter block (e.g., parameter block 215) with a main block (e.g., main block 225). Operation 515 prepares the spare partition mapping register to accommodate the physical blocks in the main plane of the swap partition that will be copied into the spare partition as part of the inter-partition wear leveling.

FIG. 6B depicts address transitions occurring in the registers 290 during execution of operation 515. The logical parameter address P2 in the swap partition registers is mapped to physical main block address PB1. Because PB1 is a main block and is to be swapped as part of the inter-partition wear leveling, logical block P2 of the spare partition registers is mapped to PB1, illustrated by the dotted arrow in FIG. 6B and a spare partition register value change as depicted in FIG. 6C. Any such logical parameter block mapped to the main plane in the swap partition (e.g., P1) is treated in a similar fashion.

Next, at operation 520, for logical blocks in the swap partition corresponding to the physical blocks not to be swapped (e.g., physical parameter blocks), the logical blocks of the spare partition are mapped to point to the address of the physical blocks not to be swapped. In the swap partition shown in FIG. 6B the logical main address M1 points to the physical parameter block address PB35. Because PB35 is a physical parameter block which may be excluded from block copy operations in particular embodiments of inter-partition wear leveling, logical main block address M1 of the spare partition is mapped back out to the parameter plane at operation 520. The logical main block address M1 of the spare partition is remapped to the physical parameter block PB35, as shown by the dotted arrow in FIG. 6C. Any such main logical block address mapped to the parameter plane in the swap partition is treated in a similar fashion. For the swap and spare partition registers depicted in FIGS. 6B-6C therefore, the logical parameter block addresses which are mapped back out to the physical main plane (e.g., P2) take the physical block addresses (e.g., PB1) that are replaced by physical parameter block addresses (PB35) which are mapped to logical main block addresses (M1).

With all of the spare partition blocks mapped correctly in the mapping registers, the block mapping controller 270 may store the remapped partition in block mapping storage 275 and the prepare copy state is advanced to the copy state 310. Generally, during the copy state 310 the logical blocks of the swap partition are copied to the corresponding logical blocks of the spare partition as background operations. In one embodiment, copying of the swap partition into the spare partition is performed as a portion of a user erase. If copies are sufficiently fast or partitions sufficiently small, an entire partition may be copied as part of a single user erase. However, in certain embodiments, the partition copy is spread across several user erase cycles to reduce the erase time push-out.

Figure 6D:
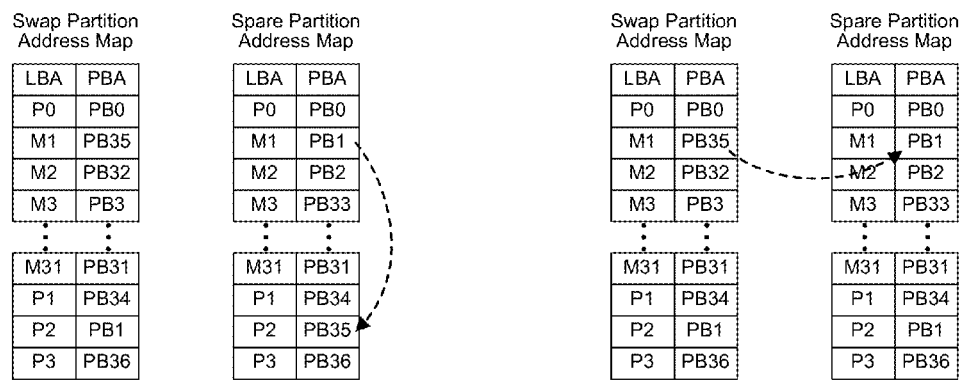
FIG. 6D illustrates a programming of a spare partition performed by a memory device in the copy state depicted in FIG. 3, in accordance with an embodiment of the present invention.
Figure 6D:
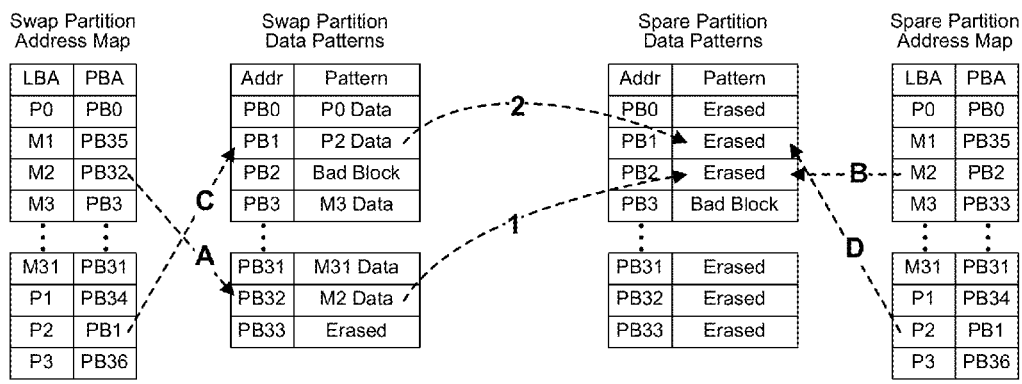

FIG. 6D shows particular examples of how a data pattern in a swap partition is copied to a spare partition. FIG. 6D depicts data content in the physical blocks of the swap partition and in the spare partition from FIG. 6C. FIG. 6D illustrates a data content copy "1" and a data content copy "2." Data content copy "1" proceeds by A) reading the "M2 data" at the physical address PB32 mapped to the logical address M2 in the swap partition; and B) writing into the erased PB2 physical address mapped to the logical address M2 of the spare partition. Data copy "2" proceeds in a similar fashion with C) reading of "P2 data" at the physical address PB1 mapped to the logical address P2 in the swap partition and D) writing the P2 data to the physical address PB1 mapped to the logical address P2 in the spare partition. The data mapped to logical blocks M2 and P0 in the swap partition are therefore copied to the corresponding logical blocks M2 and P0 in the spare partition.

Figure 7:
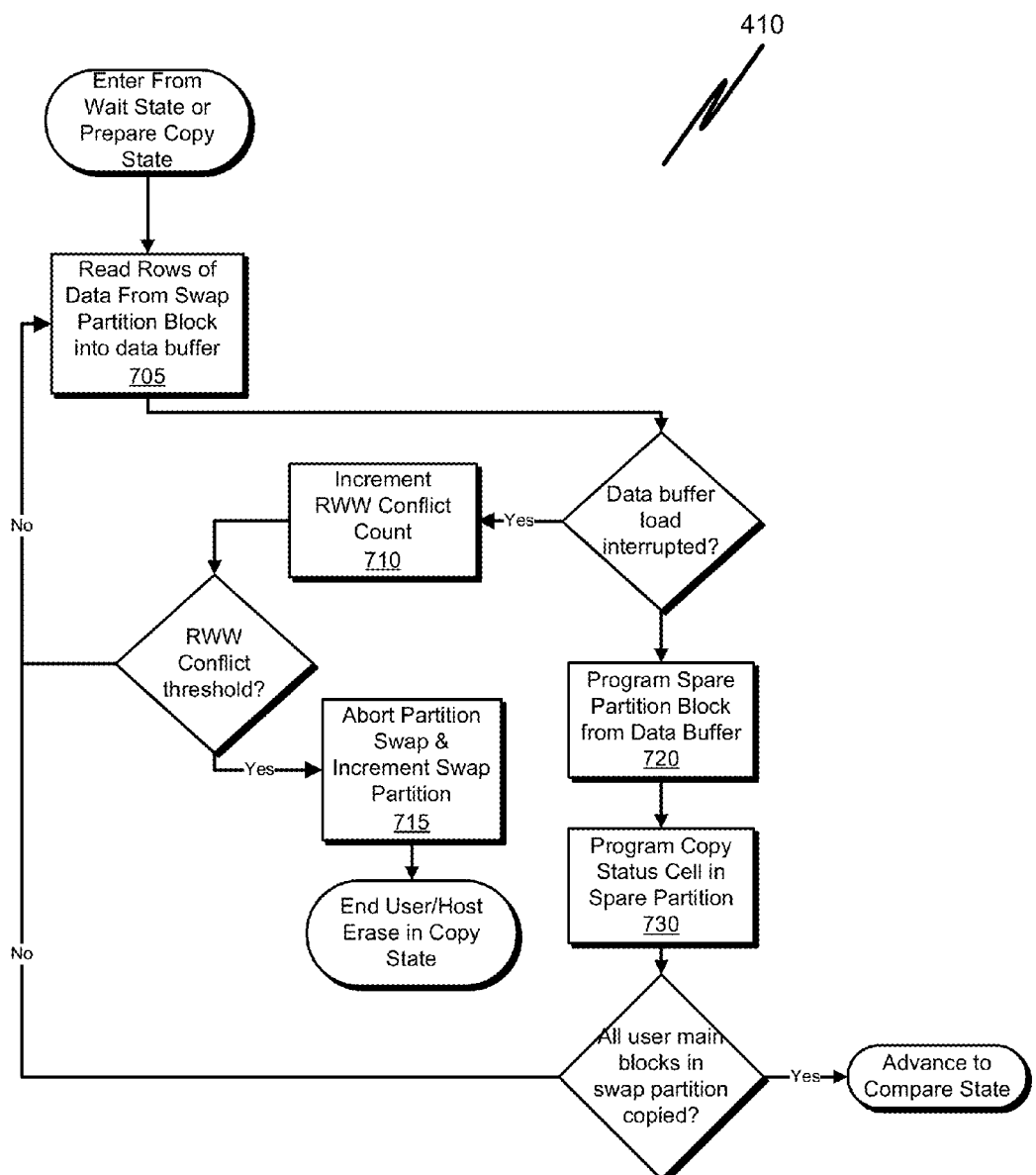
FIG. 7 depicts a flow diagram illustrating particular operations performed by a memory device in the copy state depicted in FIG. 3, in accordance with an embodiment of the present invention.

FIG. 7 depicts exemplary method 410 performed by a memory device during the copy state 310. In one embodiment, the block copy algorithm excludes any subset of memory cells which are not to be swapped (e.g., a physical parameter block). The copy method 410 enters from the prepare copy state and at operation 705, data is read in from the swap partition block (e.g., via the read buffers 250). The read data is loaded into a data buffer (e.g., program buffers 260) and at operation 720, the spare partition block is programmed. A program copy status cell or similar copy counter is then incremented to track which blocks of the swap partition have been copied. In embodiments where the block copy proceeds through sequentially addressed logical blocks, one or more status bits 276 may be set to indicate the cumulative portion of the swap partition that was copied with a particular user erase. The copy method 410 returns to operation 705 to copy another block based on the block copy status cell(s) until all blocks have been copied. Depending on the desired user erase cycle time and the rate at which blocks can be copied, operations 705, 720 and 730 may each be performed once or multiple times as an addendum to any number of customer erase cycles until the state is advanced out of the copy state.

Because the spare partition is not addressable by the host or user, access conflicts should not occur as the spare partition is programmed. However, because the swap partition is mapped to a physical partition that is not necessarily the erase partition of the user erase, there are potential read while write (RWW) conflicts as the swap partition is read into the program buffer. In particular embodiments utilizing the hardware CHA 255, if a user read to the swap partition is detected during a background read, the buffer fill is suspended and the user read is serviced at operation 710. Depending on the embodiment, if the data buffer load is interrupted, the load may be reattempted a predefined number of times until successful and if not successful, copy method 410 proceeds to operation 710 to increment a RWW counter (e.g., program a cell serving as one of the status bits 276). If the RWW conflict count is below a predefined threshold, the customer erase is merely ended while remaining in the copy state. Upon a subsequent user erase cycle, another attempt at a block copy will be made for the current swap partition. If the RWW conflict count meets the predefined threshold, a corrective action may be taken. For example, at operation 715, upon meeting a RWWW conflict count threshold, the partition swap is aborted and the swap partition is incremented to the next sequentially ordered logical partition and the user erase is ended after the state is advanced out of the copy state into the prepare clean state 325 or clean state 330 (skipping the compare state 320).

The compare state 320 accounts for the possibility that user-initiated operations during the course of block copies performed in the copy state 310 have modified one or more memory cells or blocks of cells. For example, a block may be copied from the swap partition to the spare partition and subsequently erased by a user before the copy state 310 is complete. User data may also have been written into a swap partition block after that block was copied during the copy state 310. To account for potential data corruption, the data pattern of each logical block in the swap partition is compared to that of the corresponding logical block of the spare partition. Depending on the embodiment, the comparison is performed in a manner ensuring no user initiated data changes occur to the swap partition while in the compare state 320. In one embodiment, the compare state is performed as an atomic operation. In one such embodiment, the compare state operations are appended as part of a single user erase cycle. In alternative embodiments not requiring atomicity of the compare state 320, the user erase/program events occurring in the swap partition are either communicated to the partition comparison algorithm via a change identifier or the partition comparison algorithm automatically detects such modifications to the swap partition. For example, in a PCM device, a copy status bit may be set or reset as a change identifier upon a user program/erase event and the compare algorithm would then refresh the contents of the cells associated with that copy status bit.

Figure 8:
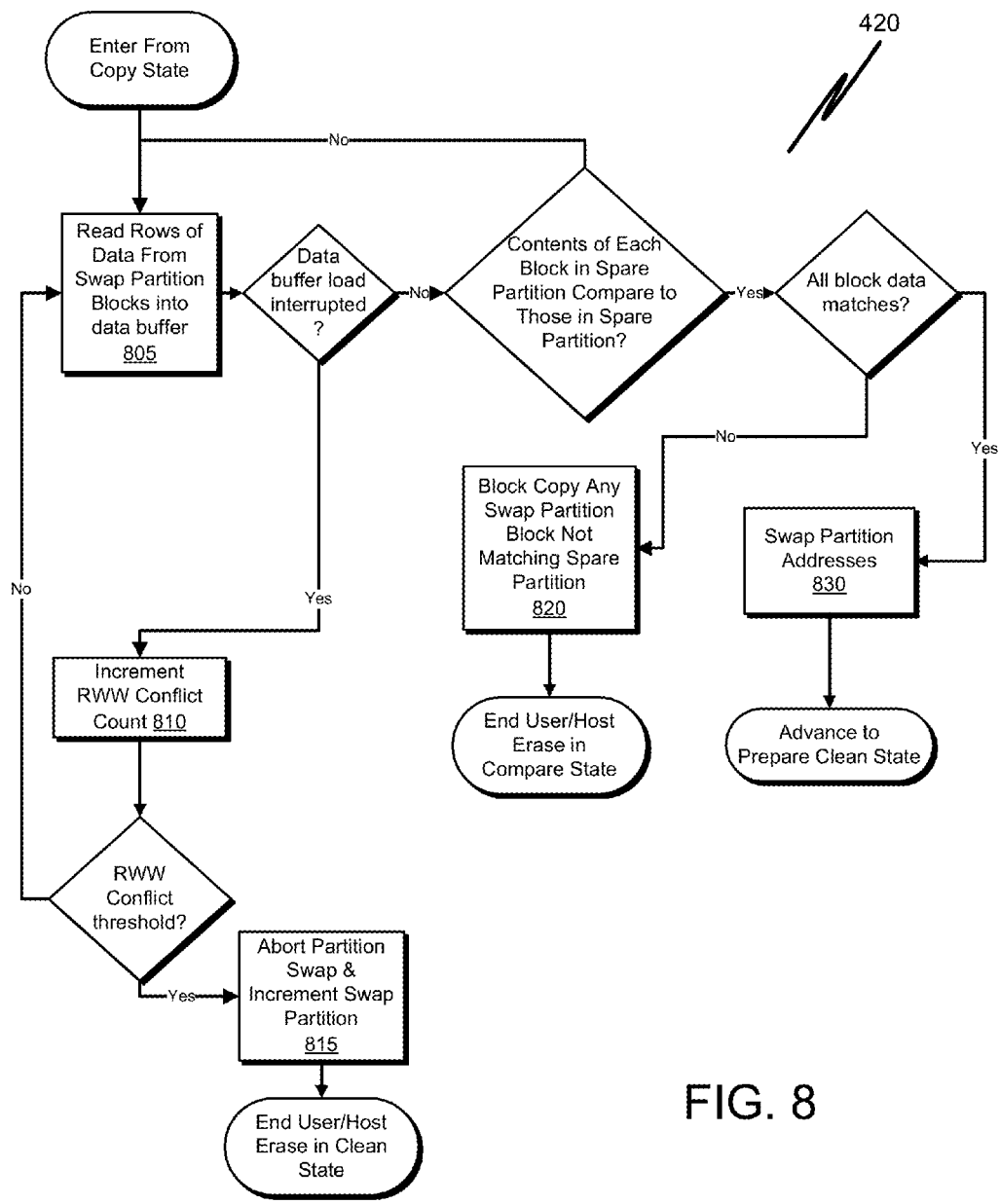
FIG. 8 depicts a flow diagram illustrating particular operations performed by a memory device in the compare state depicted in FIG. 3, in accordance with an embodiment of the present invention.

FIG. 8 depicts the exemplary compare method 420 performed in the compare state 320. The compare method 420 enters from the copy state upon successfully copying all swap partition blocks to the spare partition. At operation 805, data is read from the swap partition in a manner substantially the same as performed during the copy state 310. Again RWW conflicts may occur when accessing the swap partition. In the depicted embodiment, if a buffer load is interrupted by user activity, a RWW conflict counter is incremented at operation 810 and a corrective action then taken upon reaching a RWW conflict count threshold. In the depicted embodiment, the partition swap cycle is aborted at operation 815 if the RWW conflict threshold is reached and the swap partition is incremented to the next partition with the state set to the prepare clean state 330 or prepare clean state 325.

If however, there is no interruption during read, the contents of each block in the spare partition are read and the buffer contents compared to the contents of the corresponding logical block in the spare partition. Where any block data does not match between partitions, blocks are copied from the swap partition to the spare partition at operation 820. This may include a block erase if necessary. Following the recopy or refresh operation 820, compare method 420 signals completion of the user erase in which the comparison was integrated and the state is left in the compare state 320. The compare state 320 then returns with a subsequent user erase and block recopy/refreshes are performed incrementally until a final complete comparison of all blocks can be performed (e.g., atomically as part of a user erase where no further swap partition block refreshes are required) to ensure no data corruption.

Where all block data matches, the logical partition addresses are swapped at operation 830. For example, in one embodiment the registers 290 storing the block mapping for each of the swap partition and the spare partition are written out to swap the two partitions in the address mapper 280 and/or the block mapping storage 275. Because both partitions contained the same data pattern, the partition change is transparent to a user or host external to the memory device. At this point the swap partition becomes the new spare partition for the next partition swap cycle and the new swap partition is assigned to the next user-addressable partition (sequentially addressed or otherwise assigned under some a different logic). The state is then advanced to the prepare clean state 325 and clean state 330, if either the logical block mapping or physical memory cells require preparation before programming of a new data pattern.

Figure 9:
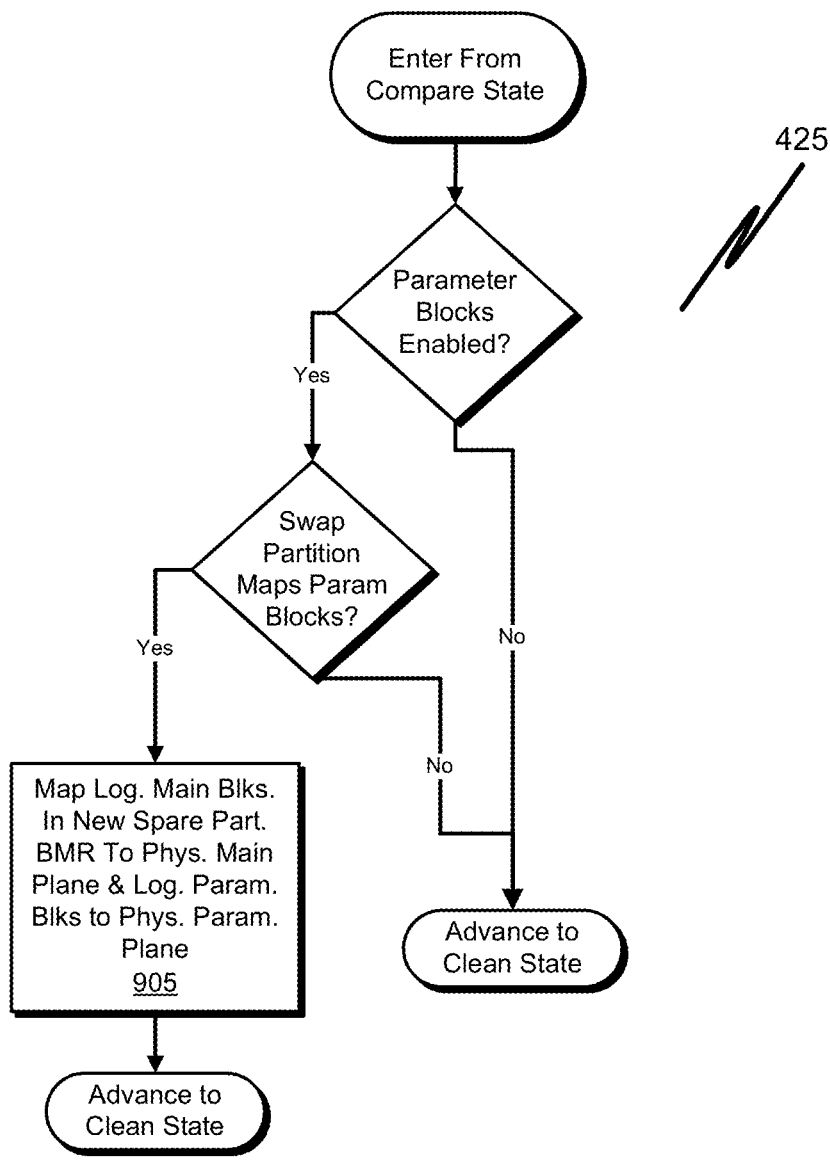
FIG. 9 depicts a flow diagram illustrating particular operations performed by a memory device in the prepare clean state depicted in FIG. 3, in accordance with an embodiment of the present invention.

Prepare clean state 325, like prepare copy state 305 accommodates embodiments where the number of user addressable blocks/cells varies between physical partitions of a memory device such that swaps of particular partitions exclude one or more user addressable memory cells (e.g., parameter blocks). FIG. 9 depicts the prepare clean method 425 which is an exemplary embodiment of operations performed in the prepare clean state 325. Entering from the compare state 320, the swap partition is readied to become the spare partition of the next partition swap cycle. If parameters blocks are enabled and the swap partition mapped such blocks then at operation 905, all logical main blocks are mapped back to the physical main plane/blocks and all logical parameter blocks are pointed back to the physical parameter plane/blocks. Prepare clean method 425 then exits to the clean state 330.

Figure 10:
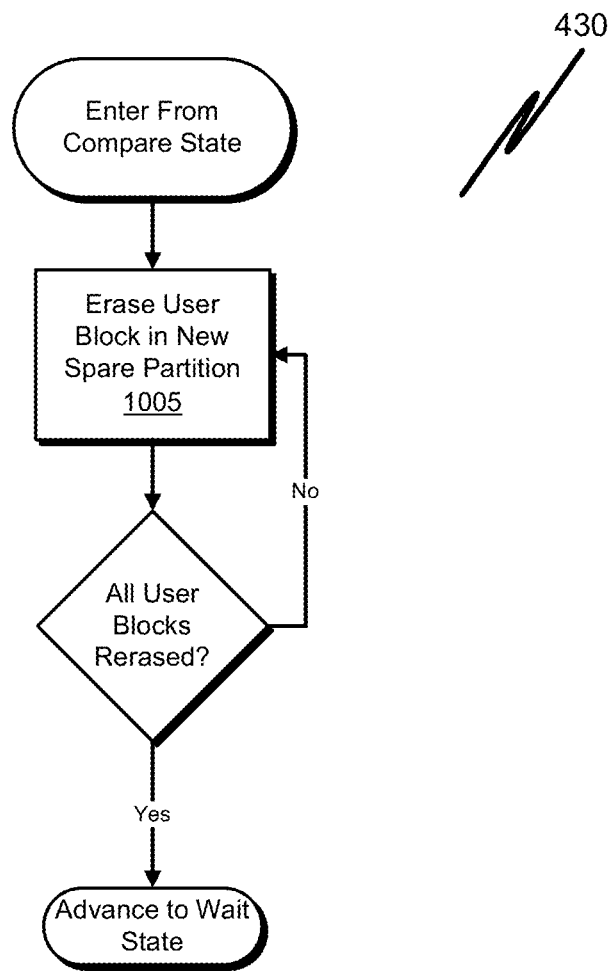
FIG. 10 depicts a flow diagram illustrating particular operations performed by a memory device in the clean state depicted in FIG. 3, in accordance with an embodiment of the present invention.

For technologies, such as flash, which do not provide bidirectional programming at the cell-level, during the clean state 330 all user addressable blocks are erased in the new partition (old swap partition) at operation 1005 depicted in FIG. 10. The erase prepares them for future copy of the next swap partition data pattern. For other cell technologies such as PCM, which do not require such a block-level erase, the clean state 330 may be omitted such that the compare state 320 advances directly to the wait state 300. Clean method 430 however is complete when all blocks in the new spare partition are successfully erased and the state is advanced to the wait state.

Figure 11:
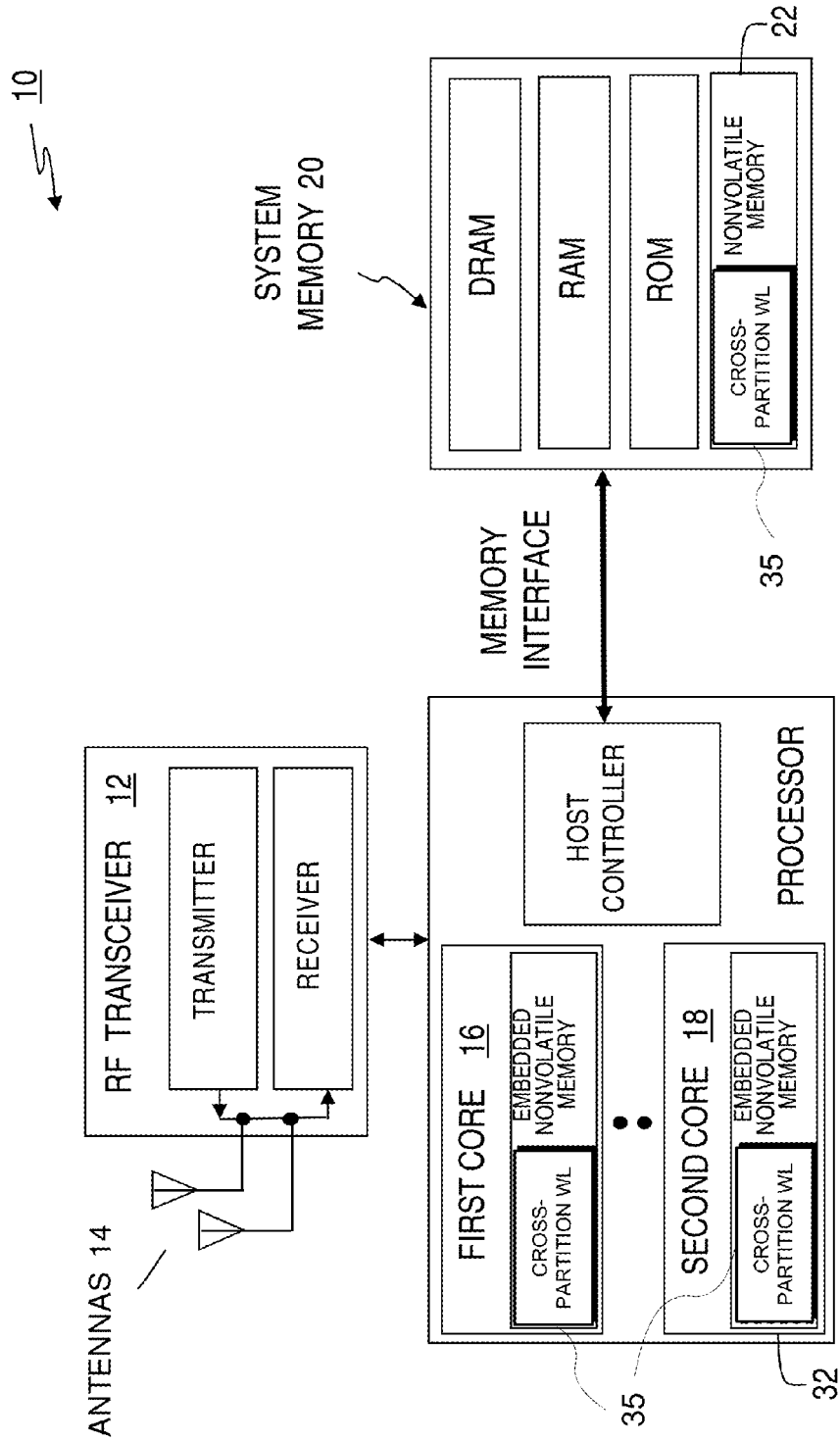
FIG. 11 illustrates a wireless architecture that incorporates memory array which may be included in a memory device configured to perform wear leveling across memory partitions, in accordance with an embodiment of the present invention.

The wireless architecture embodiment illustrated in FIG. 11 shows a communications device 10 that includes non-volatile memory with inter-partition wear leveling capabilities in accordance with embodiments of the present invention. It should be noted that the present invention is not limited to wireless communication embodiments and other, non-wireless applications may use the present invention. As shown in this wireless embodiment, a communications device 10 includes one or more antenna structures 14 to allow radios to communicate with other over-the-air communication devices. As such, communications device 10 may operate as a cellular device or a device that operates in wireless networks such as, but not limited to, Wireless Fidelity (Wi-Fi) that provides the underlying technology of Wireless Local Area Network (WLAN) based on the IEEE 802.11 specifications, WiMax and Mobile WiMax based on IEEE 802.16-2005, Wideband Code Division Multiple Access (WCDMA), and Global System for Mobile Communications (GSM) networks.

The depicted embodiment illustrates the coupling of antenna structure 14 to a transceiver 12 to accommodate modulation/demodulation. In general, analog front end transceiver 12 may be a stand-alone Radio Frequency (RF) discrete or integrated analog circuit, or transceiver 12 may be embedded with a processor having one or more processor cores 16 and 18. The multiple cores allow processing workloads to be shared across the cores and handle baseband functions and application functions. An interface may be used to provide communication or information between the processor and the memory storage in a system memory 20. The interface may comprise, for example, serial and/or parallel buses to share information along with control signal lines to be used to provide handshaking between the processor and system memory 20.

The system memory 20 may optionally be used to store instructions that are executed by the processor during the operation of wireless communication device 10, and may be used to store user data such as the conditions for when a message is to be transmitted by wireless communication device 10 or the actual data to be transmitted. For example, the instructions stored in system memory 20 may be used to perform wireless communications, provide security functionality for communication device 10, user functionality such as calendaring, email, internet browsing, etc.

Figure 12:
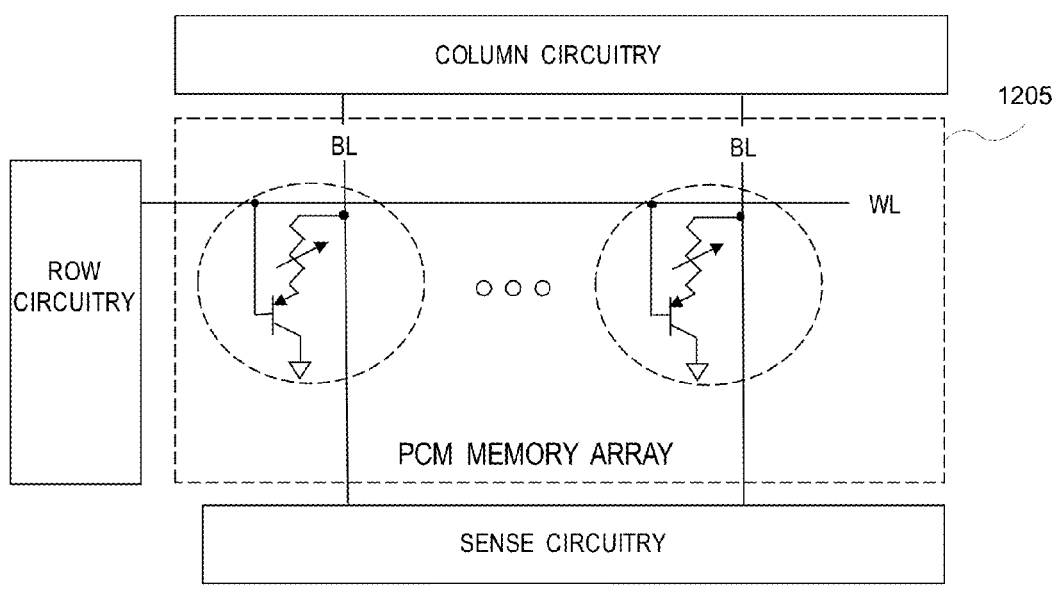
FIG. 12 is a schematic representation of a phase change memory (PCM) array which may be included in a memory device configured to perform wear leveling across memory partitions, in accordance with an alternative embodiment.
Figure 13:
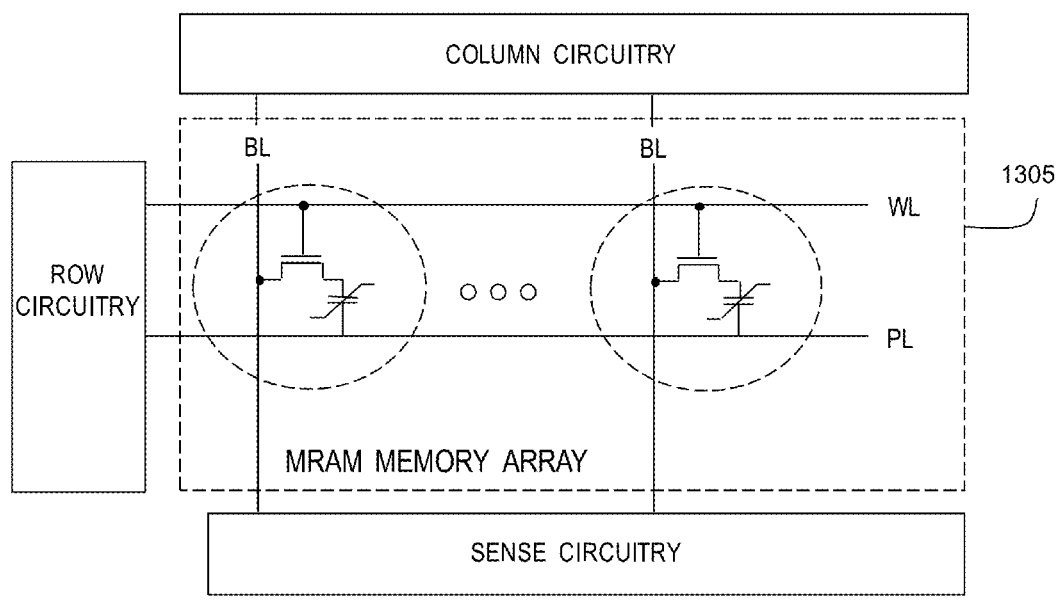
FIG. 13 is a schematic representation of an magnetic random access memory (MRAM) array which may be included in a memory device configured to perform wear leveling across memory partitions, in accordance with an alternative embodiment.
Figure 14:
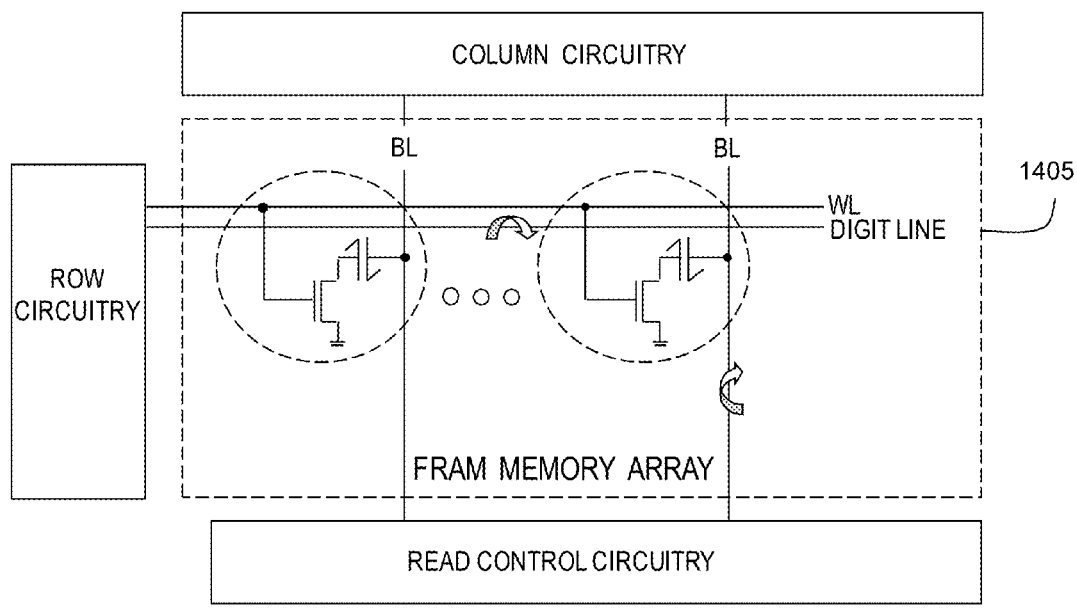
FIG. 14 is a schematic representation of a ferroelectric RAM (FRAM) array which may be included in a memory device configured to perform wear leveling across memory partitions, in accordance with an alternative embodiment.
Figure 15:
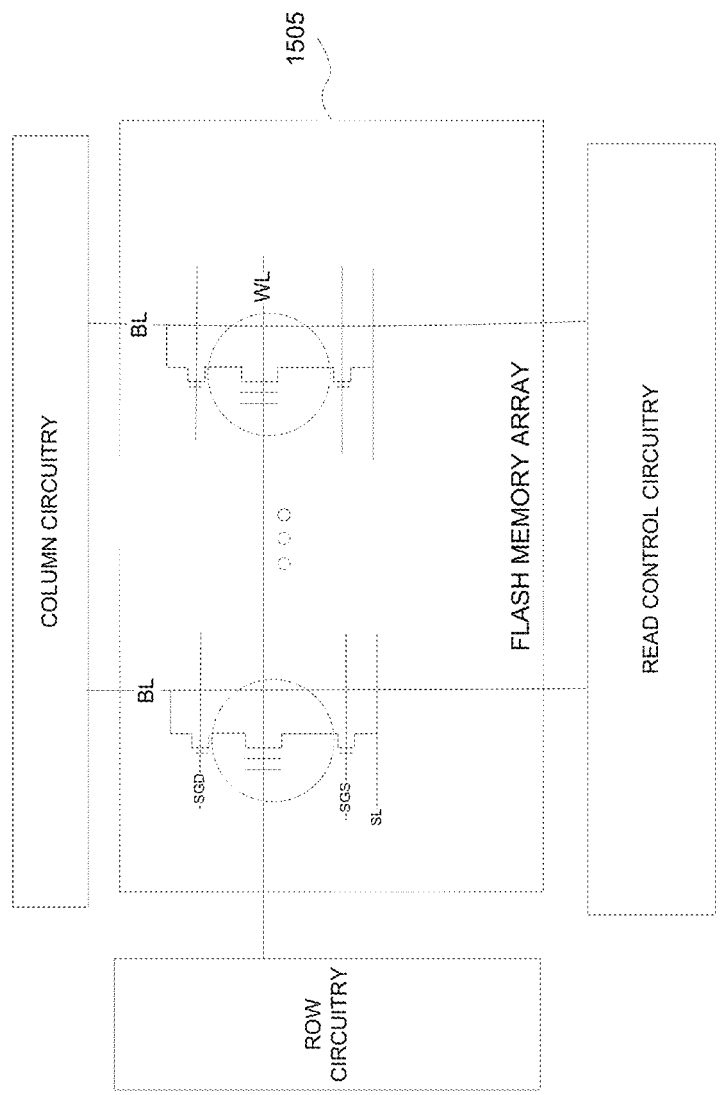
FIG. 15 is a schematic representation of a flash array which may be included in a memory device configured to refresh in a manner which detects and repairs memory cell failures, in accordance with an alternative embodiment.

System memory 20 may be provided by one or more different types of memory and may include both volatile and a non-volatile memory 22. Non-volatile memory may be a charge trapping memory such as flash (e.g., NOR, or NAND as depicted in FIG. 15) or other non-volatile memory types, such as, but not limited to PCM (e.g., as depicted in FIG. 12), Phase-Change Random Access Memory (PRAM or PCRAM), Ovonic Unified Memory (OUM), Chalcogenide Random Access Memory (C-RAM), MRAM (e.g., as depicted in FIG. 13) or FRAM (e.g., as depicted in FIG. 14). The depicted embodiment also illustrates that one or more of the processor cores may be embedded with non-volatile memory 32. Any of these non-volatile memories may include subsystems 35 configured to refresh in a manner which detects and repairs memory cell failures, as further described elsewhere herein.

FIG. 12 shows a PCM array 1205. In such an embodiment, the PCM array 1205 serves as the main physical partition_0 205 depicted in FIG. 2 to implement inter-partition wear leveling in a PCM device. Each PCM cell includes alloys of elements of group VI of the periodic table, such as Te or Se, that are referred to as chalcogenides or chalcogenic materials. Chalcogenides may be used advantageously in phase change memory cells to provide data retention and remain stable even after the power is removed from the non-volatile memory. Taking the phase change material as $Ge_2Sb_2Te_5$ for example, two phases or more are exhibited having distinct electrical characteristics useful for memory storage.

PCM array 1205 includes memory cells each having a selector device and a memory element. Although the array is illustrated with bipolar selector devices, alternative embodiments may use CMOS selector devices or diodes. By using any method or mechanism known in the art, the chalcogenic material may be electrically switched between different states intermediate between the amorphous and the crystalline states, thereby giving rise to a multilevel storing capability.

FIG. 13 shows a MRAM array 1305 where magnetic storage elements are formed from two ferromagnetic plates located at an intersection of a row and column line and selected by a Magnetic Tunnel Junction (MTJ) device. In such an embodiment, the MRAM array 1305 serves as the main physical partition_0 205 depicted in FIG. 2 to implement inter-partition wear leveling in a MRAM device.

FIG. 14 shows a FRAM array 1405 where memory cells may be a one transistor cell, or alternatively, the transistor-capacitor cell that is illustrated in the figure. In such an embodiment, the FRAM array 1405 serves as the main physical partition_0 205 depicted in FIG. 2 to implement inter-partition wear leveling in a FRAM device.

FIG. 15 shows a NAND flash memory array 1505. In such an embodiment, the NAND flash memory array 1505 serves as the main physical partition_0 205 depicted in FIG. 2 to implement inter-partition wear leveling in a NAND flash device. A cell may be coupled to a source line SL a bit line BL via select transistors. Select lines SGS and SGD may be used to control select transistors. Memory device 1505 includes word lines WL to access memory cells. Each of bit lines BL may be a physical conductor to carry information in form of charge during the program, read, or erase operation of memory device 1505. To program, read, or erase memory cells, appropriate voltages may be applied to select lines SGS and SGD, source line SL, word lines WL, and bit lines BL, as known in the art. In a similar fashion, a NOR flash memory array (not depicted) may also be utilized to implement SBC refresh in a NOR flash device.

Thus, systems and methods of full chip wear level (across partitions) have been disclosed. Although embodiments of the present invention have been described in language specific to structural features or methodological acts, it is to be understood that the invention defined in the appended claims is not necessarily limited to the specific features or embodiments described.

What is claimed is:

1. A method of wear leveling cells in a non-volatile memory device, the method comprising:
   copying a data pattern of a swap partition of the memory device into a spare partition of the memory device, the swap partition being a logical partition mapped to a physical partition addressable by a host external to the memory device, the swap partition data pattern including data in a first physical partition and a second physical partition, the copying of the data pattern excluding data in a physical parameter partition, the spare partition being a logical partition mapped to a physical partition outside of the host address space;
   reassigning the logical address of the swap partition to the physical spare partition to rotate the physical location of the swap partition data pattern; and
   repeating the copying and reassigning every time a triggering event occurs to iteratively swap partitions of the memory device.

2. The method as in claim 1, wherein for each repetition the swap partition is sequentially addressed to follow the swap partition of the previous repetition, and wherein for each repetition the spare partition is the swap partition of the previous repetition to cyclically rotate the swap partition through all host addressable partitions one partition at a time.

3. The method as in claim 2, wherein the triggering event is based on the number of erase or program commands received by the memory device from the host.

4. The method as in claim 2, wherein the triggering event is based on at least one of: erase time push-out, program time push-out, or an error count.

5. The method as in claim 1, wherein the non-volatile memory device is a flash memory device;
   wherein the swap partition data pattern comprises every main block in the mapped physical partition;
   and wherein the copying of every main block into the spare partition is performed incrementally over a plurality of host erase cycles with fewer than all main blocks of the swap partition copied with each host erase cycle.

6. The method as in claim 5, further comprising swapping logical block addresses and block data patterns between the main blocks within the swap partition to wear level the main blocks within the swap partition prior to copying the swap partition data pattern to the spare partition.

7. The method as in claim 1, wherein the first physical partition is a main partition comprising main blocks of a first size and wherein the second physical partition is a second physical parameter partition comprising parameter blocks of a second size, different than the first size, and wherein the copying of the data pattern excludes data in the parameter blocks.

8. The method as in claim 7, further comprising mapping a logical main block address which is mapped into the second physical parameter partition of the swap partition into a physical main partition of the spare partition.

9. The method as in claim 5, further comprising:
comparing, after copying the swap partition data pattern to the spare partition, every block data pattern in the spare partition to every corresponding block data pattern in the swap partition to determine the swap partition data pattern is not corrupted between the spare and swap partitions; and
reassigning the logical partition address of the swap partition to the physical spare partition, in response to determining that the spare partition matches the swap partition, to complete one partition swap.

10. The method as in claim 9, wherein the comparing of every block in the partition is either performed as an atomic operation during one host erase cycle or is dependent on a host initiated change identifier.

11. The method as in claim 5, wherein the copying of every main block further comprises a plurality of cell copy cycles, each cell copy cycle including:
loading data from a first block in the swap partition into a data buffer; and
programming a second block in the spare partition from the data buffer, the second block mapped to the same logical address that the first block was mapped to in the swap partition.

12. The method as in claim 11, wherein the loading of data from the first block in the swap partition is halted upon determining the host is attempting to read from the swap partition to allow the host data read to occur and wherein the loading of data from the first block is resumed subsequent to performance of the host data read; and wherein the method further comprises:
incrementing a read while write (RWW) conflict counter in response to determining the host is attempting to read from the swap partition while the data is loading from the first block; and
taking a corrective action in response to the RWW conflict counter reaching a threshold value.

13. A non-volatile memory device, comprising:
an array of memory cells arranged into a plurality of physical partitions including host addressable partitions and a non-host addressable partition;
a controller configured to copy a data pattern of a selected host addressable partition into the non-host addressable partition, to swap the partitions by reassigning the logical address of the selected host addressable partition to the non-host addressable partition to render the non-host addressable partition addressable, the selected host addressable partition data pattern to include data in a first physical partition and a second physical partition, the copying of the data pattern to exclude data in a first physical parameter partition, and to rotate the swap sequentially through each of the host addressable partitions by repeating the copying and reassigning each time a triggering event occurs.

14. The non-volatile memory device as in claim 13, wherein the non-host addressable partition comprises at least as many cells as a host addressable partition comprises.

15. The non-volatile memory device as in claim 13, wherein the plurality of physical partitions include a physical main partition and a second physical parameter partition, wherein the physical main partition has a first physical size and a first user addressable size, and wherein the second physical parameter partition has a second physical size, equal to the first physical size, and a second user addressable size, smaller than the first user addressable size.

16. The non-volatile memory device as in claim 13, further comprising a circuit configured to load a data buffer with data read from the selected host addressable partition and to interrupt the data load upon detecting a user read of the selected host addressable partition is being attempted.

17. The non-volatile memory device as in claim 13, wherein the non-volatile memory device further comprises:
a register to store the logical address reassignments; and
an address mapper configured to point a logical memory address received from a host to a physical memory address based on the logical address reassignments communicated from the register.

18. The non-volatile memory device as in claim 13, further comprising block mapping storage including one or more status bits indicative of a cumulative proportion of the selected host addressable partition copied to the non-host addressable partition after a host erase.

19. The non-volatile memory device of claim 13, wherein the host addressable partition comprises at least one of a plurality flash memory cells or a plurality of phase change memory (PCM) cells.

20. A wireless communication device, comprising:
a transceiver to receive over-the-air signals;
a processor core coupled to the transceiver;
a non-volatile memory embedded with the first processor core, the non-volatile memory including an array of memory cells arranged into a plurality of physical partitions including host addressable partitions to store data operated on by the processor and a non-host addressable partition; and
a controller configured to copy a data pattern of a selected host addressable partition into the non-host addressable partition, to swap the partitions by reassigning the logical address of the selected host addressable partition to the non-host addressable partition to render the non-host addressable partition addressable, the selected host addressable partition data pattern to include data in a first physical partition and a second physical partition, the copying of the data pattern to exclude data in a physical parameter partition, and to rotate the swap sequentially through each of the host addressable partitions by repeating the copying and reassigning each time a triggering event occurs.

21. The wireless communication device as in claim 20, wherein the non-volatile memory further comprises a circuit configured to load a data buffer with data read from the selected host addressable partition and to interrupt the data load upon detecting a user read of the selected host addressable partition is being attempted.

* * * * *

UNITED STATES PATENT AND TRADEMARK OFFICE
CERTIFICATE OF CORRECTION

| | | |
|---|---|---|
| PATENT NO. | : 8,601,202 B1 | Page 1 of 1 |
| APPLICATION NO. | : 12/548375 | |
| DATED | : December 3, 2013 | |
| INVENTOR(S) | : Robert Melcher et al. | |

It is certified that error appears in the above-identified patent and that said Letters Patent is hereby corrected as shown below:

In the Claims

In column 16, line 37, in Claim 19, delete "plurality" and insert -- plurality of --, therefor.

Signed and Sealed this
Twenty-fifth Day of March, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,601,202 B1  
APPLICATION NO. : 12/548375  
DATED : December 3, 2013  
INVENTOR(S) : Melcher et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 692 days.

Signed and Sealed this
Thirtieth Day of June, 2015

Michelle K. Lee
*Director of the United States Patent and Trademark Office*